(12) United States Patent
Nakagawa et al.

(10) Patent No.: US 8,368,175 B2
(45) Date of Patent: Feb. 5, 2013

(54) CAPACITOR, SEMICONDUCTOR DEVICE HAVING THE SAME, AND METHOD OF PRODUCING THEM

(75) Inventors: Takashi Nakagawa, Tokyo (JP); Kaoru Mori, Tokyo (JP); Nobuyuki Ikarashi, Tokyo (JP); Makiko Oshida, Tokyo (JP)

(73) Assignee: NEC Corporation, Tokyo (JP)

( * ) Notice: Subject to any disclaimer, the term of this patent is extended or adjusted under 35 U.S.C. 154(b) by 127 days.

(21) Appl. No.: 12/933,946

(22) PCT Filed: Mar. 27, 2009

(86) PCT No.: PCT/JP2009/056282
§ 371 (c)(1),
(2), (4) Date: Sep. 28, 2010

(87) PCT Pub. No.: WO2009/119803
PCT Pub. Date: Oct. 1, 2009

(65) Prior Publication Data
US 2011/0018100 A1 Jan. 27, 2011

(30) Foreign Application Priority Data
Mar. 28, 2008 (JP) .................................. 2008-087118

(51) Int. Cl.
H01L 21/02 (2006.01)
H01L 21/8242 (2006.01)

(52) U.S. Cl. ........ 257/532; 257/296; 257/306; 257/535; 257/E27.048; 257/E27.087; 257/E21.008; 257/E21.011; 438/239

(58) Field of Classification Search .................. None
See application file for complete search history.

(56) References Cited

U.S. PATENT DOCUMENTS

| 6,770,924 B1 * | 8/2004 | Sandhu ......................... 257/296 |
| 2005/0151184 A1 * | 7/2005 | Lee et al. ...................... 257/314 |
| 2006/0046380 A1 * | 3/2006 | Choi et al. ..................... 438/238 |

FOREIGN PATENT DOCUMENTS

| JP | 7-78788 A | 3/1995 |
| JP | 2001077111 A | 3/2001 |
| JP | 2001284284 A | 10/2001 |
| JP | 2002033320 A | 1/2002 |
| JP | 2002111094 A | 4/2002 |

(Continued)

OTHER PUBLICATIONS

International Search Report for PCT/JP2009/056282 mailed May 12, 2009.

(Continued)

*Primary Examiner* — Benjamin Sandvik
*Assistant Examiner* — Leslie Pilar Cruz

(57) ABSTRACT

Provided is a capacitor that realizes a capacitance insulation film having a large relative permittivity and has sufficient capacitance even if an occupied space is small with a reduced amount of leakage current. A capacitor includes: a capacitance insulation film; and an upper electrode and lower electrode each formed on both sides of the capacitance insulation film. The capacitance insulation film is a complex oxide whose main ingredients are Zr, Al and O with the composition ratio of Zr to Al being set at (1−x): x ($0.01 \leq x \leq 0.15$) and is composed of a dielectric substance having a crystal structure. The lower electrode is composed of a conductor whose surface contiguous to at least the dielectric film has an amorphous structure.

16 Claims, 13 Drawing Sheets

FOREIGN PATENT DOCUMENTS

| | | |
|---|---|---|
| JP | 2004214304 A | 7/2004 |
| JP | 2005123235 A | 5/2005 |
| JP | 2005217409 A | 8/2005 |
| JP | 2005243921 A | 9/2005 |
| JP | 2007158222 A | 6/2007 |
| JP | 2007201083 A | 8/2007 |
| WO | 2008108128 A | 9/2008 |

OTHER PUBLICATIONS

S. B. Qadri et al., "Phase stability of $ZrO_2$—$Al_2O_3$ thin films deposited by magnetron sputtering", Physical Review B, vol. 39, No. 9, Mar. 1989, pp. 6234-6237.

* cited by examiner

- 105: UPPER ELECTRODE
- 104: DIELECTRIC FILM
- 102: AMORPHOUS TiN
- 101: CRYSTALLIZED TiN
- 103: LOWER ELECTRODE

104: DIELECTRIC FILM
↓
CRYSTALLIZED $XZr_{(1-x)}Al_xO_y$ WITH Al COMPOSITION $0.01 \leq x \leq 0.15$

- 106: SILICON SUBSTRATE
- 107: SILICON NATURAL OXIDE FILM
- 108: CAPACITANCE INSULATION FILM
- 109: UPPER ELECTRODE

1: SILICON SUBSTRATE
2: ELEMENT ISOLATION REGION
3: GATE OXIDE FILM
4: GATE ELECTRODE
5: DIFFUSION REGION
6: FIRST INTERLAYER INSULATION FILM
7: CONTACT HOLE
8: TiN FILM
9: W FILM
10: MEMORY CELL SELECTION TRANSISTOR

13: STOPPER INSULATION FILM
14: SECOND INTERLAYER INSULATION FILM

401: TiN FILM
402: AMORPHOUS TiN FILM

18: UPPER ELECTRODE (TiN FOLM)

22: THIRD INTERLAYER INSULATION FILM
23: CONTACT HOLE

24: TiN FILM
25: BIT LINE

26: POLYCRYSTALLINE SILICON TO WHICH IMPURITIES ARE ADDED
27: TUNGSTEN

28: METAL SILICIDE LAYER
29: POLYCRYSTALLINE SILICON TO WHICH IMPURITIES ARE ADDED
30: METAL SILICIDE LAYER

31: NICKEL SILICIDE LAYER

CAPACITOR, SEMICONDUCTOR DEVICE HAVING THE SAME, AND METHOD OF PRODUCING THEM

The present application is the National Phase of PCT/JP2009/056282, filed Mar. 27, 2009, which claims priority from Japanese Patent Application No. 2008-087118 filed on Mar. 28, 2008, the entire contents of which being incorporated herein by reference.

TECHNICAL FIELD

The present invention relates to a capacitor, a semiconductor device having the capacitor, and a method of producing the capacitor and semiconductor device and particularly to a capacitor using a complex oxide film containing Zr and Al as a dielectric substance and a semiconductor device having the capacitor.

BACKGROUND ART

In the development of a semiconductor device, elements are further integrated; each element is made smaller and an operating voltage is reduced. For example, in the field of an advanced DRAM (Dynamic Random Access Memory) device, the shrinking of the size of a memory cell leads to a limited space occupancy for capacitors that make up a memory cell. If the capacitors do not have enough capacitance, the memory cell is prone to malfunctioning as the electric charge of the capacitors decreases due to noise signals from the outside and the like. Such malfunctions trigger errors, one typical example of which is a soft error.

In general, the capacitance of the capacitors that make up the memory cell of the DRAM device is in proportion to a surface area of an electrode and a relative permittivity of the dielectric substance and in inverse proportion to the distance between electrodes. In order to realize capacitors of a memory cell required to make the advanced DRAM device, it is necessary to use a dielectric film that has a high relative permittivity and can be made thin without an increase in leakage of current.

The use of $HfO_2$, $ZrO_2$ and $Al_2O_3$ is examined as means for increasing the capacitance of the capacitors of the DRAM: $HfO_2$, $ZrO_2$ and $Al_2O_3$ have higher relative permittivities than a conventional capacitance insulation film such as a $SiO_2$ film, a SiN film or a SiON film, which is a combination of both. Recently, in order to reduce an increase in leakage of current associated with a thinner capacitance insulation film, research has been conducted on a capacitance insulation film generated by doping a laminated structure of $HfO_2$, $ZrO_2$ and $Al_2O_3$ or $HfO_2$ and $ZrO_2$ with a metal element. Development is under way to improve the electrical properties of the capacitors through the optimization of electrode materials that make up the capacitors.

For example, PTLs 1 and 2 show capacitance insulating materials generated by doping $HfO_2$ and $ZrO_2$ with such metal elements as aluminum (Al), scandium (Sc) and lanthanum (La). PTLs 1 and 2 state that the doping of $HfO_2$ and $ZrO_2$ with the above metal elements changes an electron affinity of an dielectric material as well as the barrier height of electrons and positive holes, and that an amorphous dielectric material tends to be formed as the formation of a crystal structure decreases or vanishes due to the existence of doping metals. PTLs 1 and 2 state that the relative permittivity of the dielectric material is anywhere between 10 and 25.

What is disclosed in PTL 3 is an amorphous film that has a crystal dielectric substance to which amorphous aluminum oxide is added as a capacitance insulation film and is made with $Al_xM_{(1-x)}O_y$ (M represents a metal that can form a crystal dielectric substance such as Hf or Zr) with the composition 0.05<x<0.3. A feature of the technique is to prevent the breaking of insulation of the capacitance insulation film while keeping a high relative permittivity of 25 to 28 with amorphous zirconium aluminate. PTL 3 states that the relative permittivity of $ZrO_2$ is 30.

NPL 1 states that an amorphous $ZrO_2$—$Al_2O_3$ thin film, made by magnetron sputtering, crystallizes and thus has a tetragonal or monoclinic crystal structure when being annealed at 1,000 degrees Celsius. According to NPL1, the amorphous $ZrO_2$—$Al_2O_3$ thin film crystallizes into a monoclinic crystal structure when the atom ratio of Zr to Al is 76:24; a tetragonal crystal structure is dominant when the atom ratio is 52:48. However, the value of relative permittivity is not disclosed.

PTL 4 states that in a capacitor having a capacitance film composed of $ZrO_2$, as for the composition ratio of a TiN electrode that makes up an upper electrode, when titanium is set at 100% in atom ratio, carbon comes to 25 to 36%, nitrogen to 60 to 72%, and oxygen to 28 to 35% in order to prevent the deterioration of electrical properties associated with plasma treatment.

CITATION LIST

Patent Literature

{PTL 1} JP-A-2002-33320
{PTL 2} JP-A-2001-77111
{PTL 3} JP-A-2004-214304
{PTL 4} JP-A-2005-243921
{NPL 1} S. B. Qadri, C. M. Gilmore, C. Quinn, E. F. Skelton, and C. R. Gossett, "Phase stability of $ZrO_2$—$Al_2O_3$ thin films deposited by magnetron sputtering", Physical Review B, 39-9, 1989, p. 6234-6237

SUMMARY OF INVENTION

Technical Problem

However, the above related techniques have the following problems.

According to the technique disclosed in PTLs 1 and 2 of changing an electron affinity of a dielectric material as well as the barrier height of electrons and positive holes by doping $HfO_2$ and $ZrO_2$ with such metal elements as aluminum (Al), scandium (Sc) and lanthanum (La), the relative permittivity of a capacitance insulation film to be obtained is anywhere between 10 to 25, a larger drop in relative permittivity than a capacitance film that is not doped. Therefore, it is impossible to obtain the effect of a higher permittivity in reducing the leakage of current.

According to the technique disclosed in PTL 3 of making an amorphous film with the amount of Al added to $ZrO_2$ being in the range of 5 to 30%, the relative permittivity of $ZrO_2$ is anywhere between 25 and 28 due to the doping of $ZrO_2$ with Al, a larger drop than when $ZrO_2$ is not doped. Therefore, it is impossible to obtain the effect of a higher permittivity in reducing the leakage of current.

In the case of the crystallized film, disclosed in NPL1, that is made by annealing an amorphous $ZrO_2$—$Al_2O_3$ thin film at 1,000 degrees Celsius, it is unclear what kind of crystal is obtained with any composition other than the above and what is the relative permittivity to be obtained.

In the case of the capacitor, disclosed in PTL 4, that has the capacitance film composed of $ZrO_2$ as well as the optimized electrode in such a way that, as for the composition ratio of the TiN electrode that makes up the upper electrode, carbon comes to 25 to 36%, nitrogen to 60 to 72%, and oxygen to 28 to 35% when titanium is set at 100% in atom ratio, PTL 4 does not describe the effects of the change in quality of the electrode material caused by plasma treatment on the relative permittivity of the capacitance film. Therefore it is impossible to increase the permittivity of the capacitance film through the optimization of the electrode material as well as to reduce the leakage of current.

The object of the present invention is to solve the problems with the above related techniques and to provide a capacitor that realizes a capacitance insulation film having a large relative permittivity and has sufficient capacitance even if an occupied space is small with a reduced amount of leakage current.

Solution to Problem

To achieve the above object, a capacitor of the present invention includes: a capacitance insulation film; and an upper electrode and lower electrode each formed on both sides of the capacitance insulation film, the capacitance insulation film being a complex oxide whose main ingredients are Zr, Al and O with the composition ratio of Zr to Al being set at (1−x): x ($0.01 \leq x \leq 0.15$) and being composed of a dielectric substance having a crystal structure, and the lower electrode being composed of a conductor whose surface contiguous to at least the capacitance insulation film has an amorphous structure.

ADVANTAGEOUS EFFECTS OF INVENTION

According to the present invention, it is possible to prevent the deterioration of electrical properties of the capacitor associated with the crystallization of a metal film that makes up the lower electrode and increase the permittivity of the capacitance insulation film. Even if elements are made smaller, it is possible to realize the capacitor having a sufficiently large capacitance with leakage current being reduced.

REFERENCE SIGNS LIST

Figure 1:
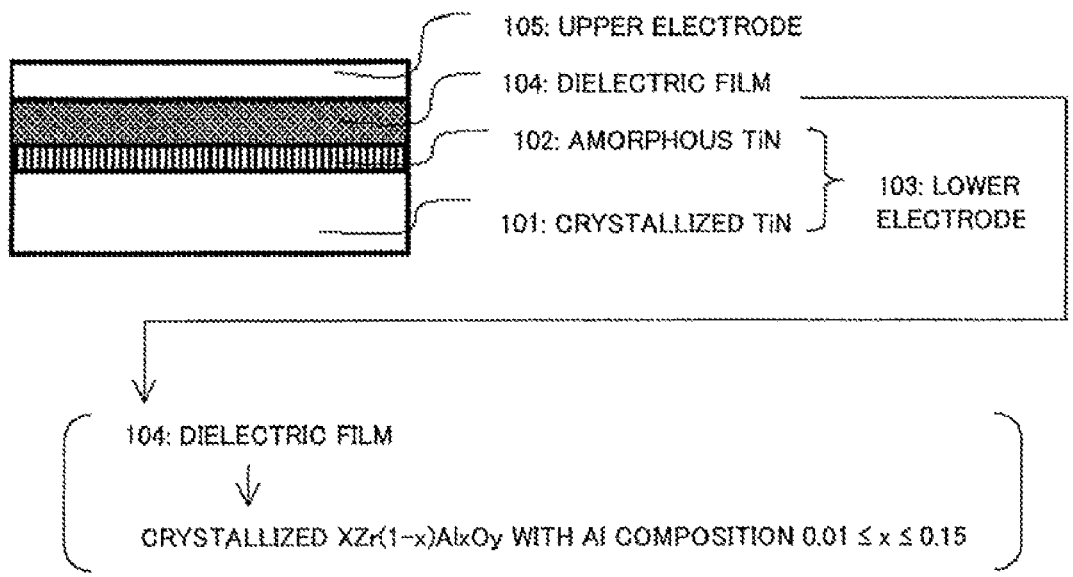
{FIG. 1} A schematic diagram showing the cross-sectional structure of a capacitor, which is a semiconductor element, according to an exemplary embodiment of the present invention.

1: Silicon substrate
2: Element isolation region
3: Gate oxide film
4: Gate electrode
5: Diffusion region 6: First interlayer insulation film
7: Contact hole
8: TiN film
9: W film
10: Memory cell selection transistor
11: Capacitance contact
12: Bit contact
13: Stopper insulation film
14: Second interlayer insulation film
15: Cylinder groove
16: Lower electrode
17: Capacitance insulation film
18: Upper electrode (TiN film)
19: Capacitor having MIM structure
20: Capacitance line
21: Opening
22: Third interlayer insulation film
23: Contact hole
24: TiN film
25: Bit line
26: Polycrystalline silicon to which impurities are added
27: Tungsten
28: Metal silicide layer
29: Polycrystalline silicon to which impurities are added
30: Metal silicide layer
31: Nickel silicide layer
101: Crystallized TiN film
102: Amorphous TiN film
103: Lower electrode
104: Capacitance insulation film
105: Upper electrode
106: Silicon substrate
107: Silicon natural oxide film
108: Capacitance insulation film
109: Upper electrode
201: Crystallized TiN film
202: Amorphous TiN film
203: Lower electrode
204: Capacitance insulation film
205: Upper electrode
301: Silicon substrate
302: Crystallized TiN film
303: Amorphous TiN film
304: Lower electrode
305: Capacitance insulation film
306: Upper electrode
401: TiN film
402: Amorphous TiN film {Description of Embodiments}

The following describes in detail a capacitor and a semiconductor device having the capacitor according to an exemplary embodiment of the present invention with reference to the accompanying drawings.

FIG. 1 shows the cross-sectional structure of a capacitor, which is a semiconductor element, according to the present exemplary embodiment. As shown in FIG. 1, the capacitor of the present exemplary embodiment is equipped with an upper electrode 105 on the upper surface of a capacitance insulation film 104 and a lower electrode 103 on the lower surface thereof.

As shown in FIG. 1, the lower electrode 103 consists of a laminated film including a TiN film 101, which is a crystallized lower layer, and a TiN film 102, which is an amorphous upper layer.

The capacitance insulation film 104 is made with a dielectric film of Complex oxide whose main ingredients are Zr, Al and O. A high relative permittivity of the capacitance insulation film 104 is obtained by optimizing the Al composition of $Zr_{(1-x)}Al_xO_y$ and crystallizing. However, the quality of the $Zr_{(1-x)}Al_xO_y$ film is largely affected by the state of crystallization on the surface of the lower electrode 103. If the lower electrode 103 crystallizes, the quality of the film decreases, making it difficult to reduce leakage current. According to the capacitor of the present exemplary embodiment, the surface of the lower electrode 103 that is in contact with at least the capacitance insulation film 104 has an amorphous structure. Therefore, it is possible to reduce a drop in the quality of the dielectric film made from the $Zr_{(1-x)}Al_xO_y$ film generated by optimizing the Al composition and crystallizing and decrease leakage current. The present exemplary embodiment is based on such a new piece of knowledge. The following describes the new piece of knowledge.

First, the effects of the $Zr_{(1-x)}Al_xO_y$ film serving as the dielectric film that makes up the capacitance insulation film 104 will be described using an example of the electrical properties of a MIS (Metal-Insulator-Semiconductor) capacitor structure in which the $Zr_{(1-x)}Al_xO_y$ film is formed on a silicon substrate having a silicon natural oxide film on the surface.

Figure 2:
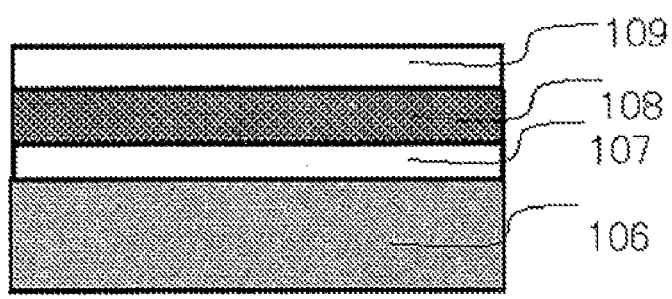
{FIG. 2} A schematic diagram showing the cross-sectional structure of a capacitor, which is a semiconductor element, according to an exemplary embodiment of the present invention.

As shown in FIG. 2, a film (capacitance insulation film) 108 is deposited on a silicon substrate 106 having a silicon natural oxide film 107 on the surface by magnetron sputtering with the use of a target consisting of Zr and Al: the main ingredients of the film 108 are Zr, Al and O. The temperature of the substrate is set at 300 degrees Celsius. A sample in which $ZrO_2$ is deposited with the use of the target not including Al is also produced for comparison.

Then, a mixture of the film 108 whose main ingredients are Zr, Al and O is annealed at 600 degrees Celsius under an oxygen atmosphere to produce the $Zr_{(1-x)}Al_xO_y$ film in which Al has diffused evenly into $ZrO_2$ and crystallized: the thickness of the $Zr_{(1-x)}Al_xO_y$ film is between 2 nm to 20 nm.

Incidentally, in this case, annealing is performed under an oxygen atmosphere. Instead, an inert gas such as nitrogen or Ar may be used when necessary. Annealing may be conducted under an atmosphere of a mixture of the above gases. A desired composition x is determined by a mixture ratio of Zr and Al in the target. Since a typical annealing process could cause an oxygen deficiency, a composition y can be $y \leq 2-0.5x$. However, if the lower limit of the composition y is $1 \leq y$, it is possible to obtain the effect of the present exemplary embodiment as described below. Similarly, $ZrO_2$ is annealed at 600 degrees Celsius under an oxygen atmosphere.

Subsequently, an Au layer with a thickness of 100 nm is deposited on the annealed $Zr_{(1-x)}Al_xO_y$ film and $ZrO_2$ film by a vacuum deposition method, and a first capacitor and a second capacitor are formed on each. In this case, the silicon substrate 106 acts as a first electrode, and the Au as a second electrode (upper electrode) 109. Incidentally, a third capacitor and a fourth capacitor are formed on each for comparison by depositing a second electrode without an annealing process for the $Zr_{(1-x)}Al_xO_y$ film and the $ZrO_2$ film.

Then, the electrical properties of the first capacitor (which has undergone the annealing process) and third capacitor (which has not undergone the annealing process) that use the $Zr_{(1-x)}Al_xO_y$ film are measured. First, a voltage is applied to the first electrode, and EOT (Equivalent Oxide Thickness) is evaluated by CV (capacitance-voltage) measurement: EOT=1.3 nm. EOT is a value obtained by converting the physical thickness of a dielectric substance to the electrical thickness of a film equivalent to a $SiO_2$ film. As for the measurement of the electrical properties, leakage current is measured when a voltage of (Vfb−1)V is applied to the upper electrode for a flat band voltage Vfb obtained from the CV characteristic of the MIS structure while the following is taken into account: the impact of a surface potential resulting from a difference in thickness between insulating films on the IV (current-voltage) characteristic.

Figure 3:
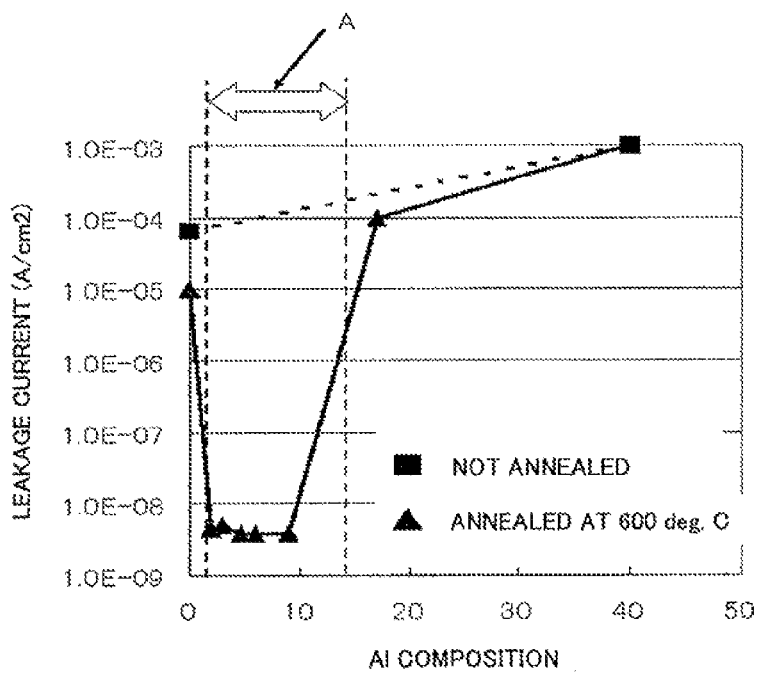
{FIG. 3} A graph showing the relationship between the leakage current and Al composition of a capacitor, which is a semiconductor element, according to an exemplary embodiment of the present invention.

FIG. 3 shows both the relationship between the leakage current of the first capacitor and the Al composition (see ▲ (annealed at 600 degrees'Celsius) in the diagram) and the relationship between the leakage current of the third capacitor and the Al composition (see ■ (not annealed) in the diagram) (Horizontal axis: Al composition [%], Vertical axis: leakage current [A/cm$^2$]). It is clear from FIG. 3 that since the annealing process is performed. a remarkable phenomenon of leakage current appears within the Al composition range $0.02 \leq x \leq 0.10$; it is found that the leakage current obtained is less than or equal to $1.0 \times 10^{-8}$ A/cm$^2$.

Similarly, the electrical properties of the second capacitor (which has undergone the annealing process) and fourth capacitor (which has not undergone the annealing process) that use the ZrO$_2$ film are measured. The results are shown in FIG. 3 as well (see ▲ (annealed at 600 degrees Celsius) for the Al composition x=0 in the diagram for the second capacitor as well as ■ (not annealed) for the Al composition x=0 in the diagram for the fourth capacitor. It is clear from FIG. 3 that in the case of the capacitors that use the ZrO$_2$ film, there is no change in leakage current before and after the annealing process and the leakage current is about $1.0 \times 10^{-5}$ A/cm$^2$ in both cases.

Given the above results, it is confirmed that a remarkable decrease in leakage current is brought about when the annealing process is conducted within the Al composition range $0.02 \leq x \leq 0.10$.

Figure 4:
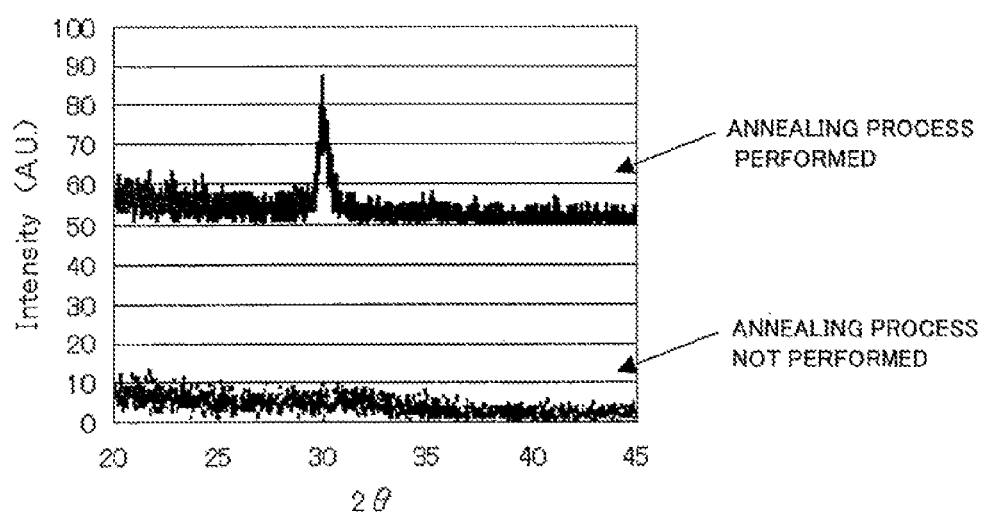
{FIG. 4} A graph showing an XRD spectrum of a metal oxide film of a capacitor, which is a semiconductor element, according to an exemplary embodiment of the present invention.
Figure 5:
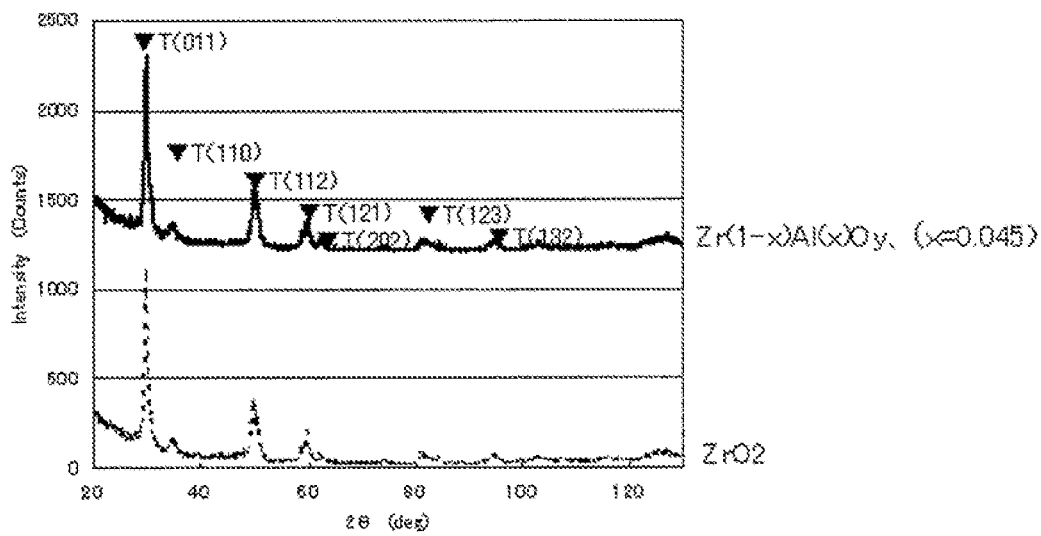
{FIG. 5} A graph showing an XRD spectrum of a metal oxide film of a capacitor, which is a semiconductor element, according to an exemplary embodiment of the present invention.

FIG. 4 shows the XRD (X-ray diffraction) diffraction spectrums of the $Zr_{(1-x)}Al_xO_y$ film that has not yet been annealed (which has not undergone the annealing process) and of the $Zr_{(1-x)}Al_xO_y$ film that has been annealed (which has undergone the annealing process) with the Al composition x=0.045. FIG. 5 shows the XRD diffraction spectrums of the annealed $Zr_{(1-x)}Al_xO_y$ film and ZrO$_2$ film (Horizontal axis: diffraction angle of 2θ [deg], Vertical axis: strength).

It is clear from FIG. 4 that even though the state of the $Zr_{(1-x)}Al_xO_y$ film is amorphous immediately after the formation of the film, the $Zr_{(1-x)}Al_xO_y$ film is crystallized by annealing and the crystal structure thereof is tetragonal. It is clear from FIG. 5 that there is no large difference between the XRD spectrums of the annealed $Zr_{(1-x)}Al_xO_y$ film and ZrO$_2$ film, the effects of the added Al on the crystal phase of ZrO$_2$ is not confirmed, and the crystal structure of the ZrO$_2$ film is tetragonal as in the case of the $Zr_{(1-x)}Al_xO_y$ film.

Given the above results, it is found that the improvements of the properties resulting from the added Al are not attributable to the changed crystal phase.

It is clear from the above that the formation of the dielectric film of the present exemplary embodiment is attributable to a predetermined amount of Al added as well as the annealing process that makes the amorphous film crystallize.

Incidentally, it is obvious from FIG. 3 that it is the Al composition range $0.01 \leq x \leq 0.15$ (see A in FIG. 3) that enables the leakage current less than $1.0 \times 10^{-5}$ A/cm$^2$ to be obtained. It is also obvious from FIG. 3 that in order to obtain a remarkably lower leakage current that is less than or equal to $1.0 \times 10^{-8}$ A/cm$^2$, it is desirable that the upper limit of the Al composition be $x \leq 0.10$ and the lower limit of the AL composition be $0.02 \leq x$.

The permittivities of the $Zr_{(1-x)}Al_xO_y$ and ZrO$_2$ films used for the first to fourth capacitors are measured. The relative permittivities of those unable to reduce leakage current, the unannealed $Zr_{(1-x)}Al_xO_y$ film, the unannealed ZrO$_2$ film and the annealed ZrO$_2$ film, are about 30; the relative permittivity of the $Zr_{(1-x)}Al_xO_y$ film ($0.01 \leq x \leq 0.15$) crystallized by annealing, which is able to reduce leakage current, is between 40 and 70. It is obvious that the crystallized $Zr_{(1-x)}Al_xO_y$ film has a remarkably larger relative permittivity than the amorphous $Zr_{(1-x)}Al_xO_y$ film. Therefore, it is proved that the reduction of leakage current is made possible by the remarkable increase in the relative permittivity of the crystallized $Zr_{(1-x)}Al_xO_y$ film.

Then, a mixture of the ZrO$_2$—Al$_2$O$_3$ films formed in the above manner is annealed at 400 degrees Celsius under an oxygen atmosphere to produce the $Zr_{(1-x)}Al_xO_y$ film.

Figure 6:
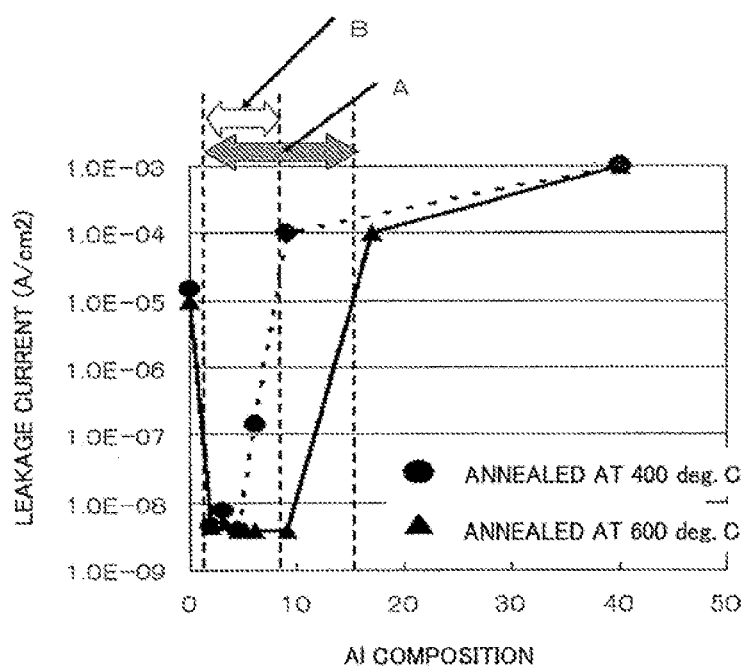
{FIG. 6} A graph showing the relationship between the leakage current and Al composition of a capacitor, which is a semiconductor element, according to an exemplary embodiment of the present invention.

FIG. 6 shows the relationship between the leakage current of the $Zr_{(1-x)}Al_xO_y$ film and the Al composition (see ● (annealed at 400 degrees Celsius) in the diagram) when the thickness of the film formed on a silicon natural oxide film comes to EOT=1.3 nm and the $Zr_{(1-x)}Al_xO_y$ film is annealed at 400 degrees Celsius, along with the result of the case where the film is annealed at 600 degrees Celsius as illustrated in FIG. 3 (see ▲ (annealed at 600 degrees Celsius) in the diagram) (Horizontal axis: Al composition [%], Vertical axis: leakage current [A/cm$^2$]).

It is obvious from FIG. 6 that when the film is annealed at 400 degrees Celsius, a remarkable drop in leakage current is observed within the Al composition range $0.01 \leq x \leq 0.08$ (see B in FIG. 6). In particular, it is clear that when the upper limit of the Al composition is $x \leq 0.05$ and the lower limit of the Al composition is $0.02 \leq x$, the leakage current obtained is less than or equal to $1.0 \times 10^{-8}$ A/cm$^2$. That is, it is found that even in the case of the 400-degrees-Celsius annealing process, a remarkable drop in leakage current can be confirmed within the desired Al composition range even though the desired Al composition range is not as broad as the composition range for the 600-degrees-Celsius annealing process (see A in FIG. 6).

When the annealing process is conducted at 400 degrees Celsius, the XRD diffraction spectrum of the $Zr_{(1-x)}Al_xO_y$ film with x=0.045 is the same as in the cases of FIGS. 4 and 5. That is, it is found that leakage current is reduced because of a predetermined amount of Al added as well as the annealing process that makes the amorphous film crystallize. The relative permittivity of the $Zr_{(1-x)}Al_xO_y$ ($0.01 \leq x \leq 0.08$) film crystallized by the 400-degrees-Celsius annealing process is evaluated: the value of the relative permittivity falls in the range of 40 to 70 as in the case of the 600-degrees-Celsius annealing process.

Figure 7:
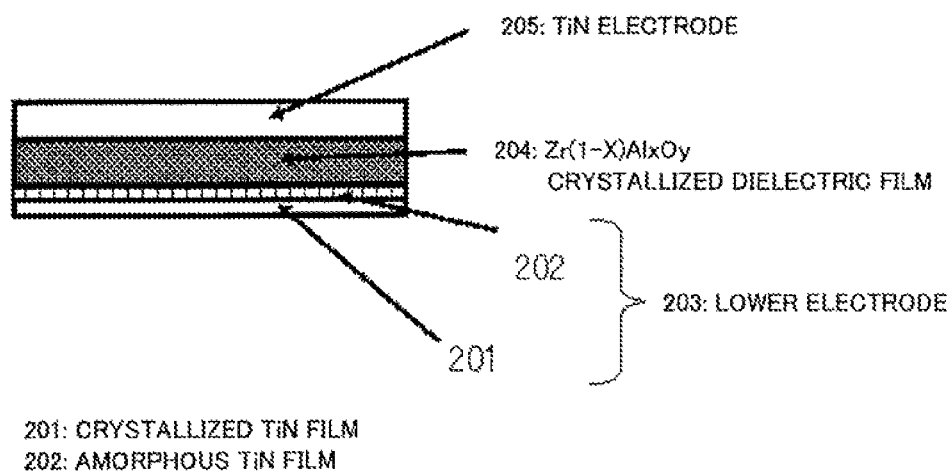
{FIG. 7} A schematic diagram showing the cross-sectional structure of a capacitor, which is a semiconductor element, according to an exemplary embodiment of the present invention.

The following describes the impact of the crystallization of the lower electrode on capacitance characteristics using a lower electrode 203 illustrated in FIG. 7 as an example of electrode characteristics of a MIM (Metal-Insulator-Metal) capacitor structure having a TiN electrode 202 having an amorphous surface.

As shown in FIG. 7, the crystallized TiN film 201 that makes up the lower electrode 203 is formed on a silicon substrate by MOCVD (Metal Organic Chemical Vapor Deposition). The surface of the crystallized TiN film 201 is turned into an amorphous state by a radical nitridation process to form the amorphous TiN film 202. Then, the crystallized $Zr_{(1-x)}Al_xO_y$ film is formed as a dielectric film 204 on the amorphous TiN film 202. The steps following the formation of the $Zr_{(1-x)}Al_xO_y$ film are the same as those for producing the MIS capacitor, in which case the $Zr_{(1-x)}Al_xO_y$ film is formed on the silicon natural oxide film as described above.

The electrical properties of the MIM capacitor having the lower electrode including the TiN film whose surface is in a different state, which is made in the above manner, is evaluated. The dielectric film is a film crystallized by annealing the $Zr_{(1-x)}Al_xO_y$ film with x=0.045.

Figure 8:
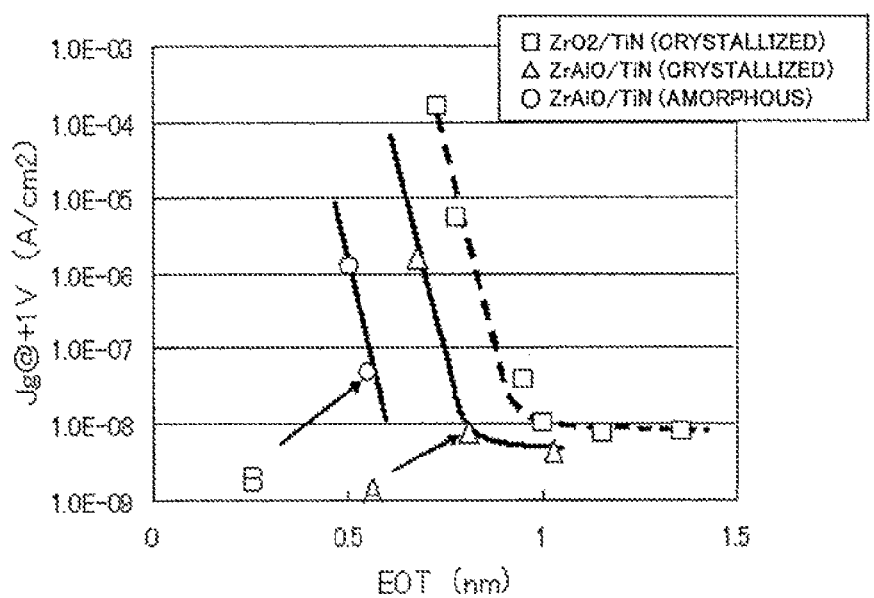
{FIG. 8} A graph showing the relationship between the EOT and leakage current of a capacitor, which is a semiconductor element, according to an exemplary embodiment of the present invention.

FIG. 8 shows the comparison of crystallization states of the lower electrode 203 in terms of the relationship between the EOT and leakage current for elements obtained from CV measurements (Horizontal axis: Al composition [%], Vertical axis: leakage current (Jg@+1V) [A/cm$^2$]). For comparison, FIG. 8 also shows a capacitor (see □ in the diagram) on which formed as a dielectric film is $ZrO_2$ to which Al is not added on TiN that is crystallized as the lower electrode 203. In FIG. 8, it is confirmed that even when the crystallized TiN is applied as the lower electrode (see Δ in the diagram), the use of $Zr_{(1-x)}Al_xO_y$ as a dielectric film helps make the EOT thinner than when the $ZrO_2$ to which Al is not added is used.

It is also confirmed that the leakage current is less than or equal to $1 \times 10^{-7}$ A/cm$^2$ when EOT=0.6 nm as the $Zr_{(1-x)}Al_xO_y$ film is formed on the TiN electrode having a amorphous surface (see ○ in the diagram). Meanwhile, when the crystallized TiN is used as the lower electrode, the leakage current is $1.5 \times 10^{-6}$ A/cm$^2$ when EOT=0.7 nm. Therefore, it is found that the use of the TiN electrode having an amorphous surface as the lower electrode helps reduce leakage current as well as make the EOT thinner.

Then, the sections of sample A (the $Zr_{(1-x)}Al_xO_y$ film formed on the crystallized TiN) and sample B (the $Zr_{(1-x)}Al_xO_y$ film formed on the laminated film of the amorphous TiN and crystallized TiN) shown in FIG. 8 are analyzed with a transmission electron microscope (TEM). The samples A and B are each annealed and the $Zr_{(1-x)}Al_xO_y$ films are crystallized.

Figure 9:
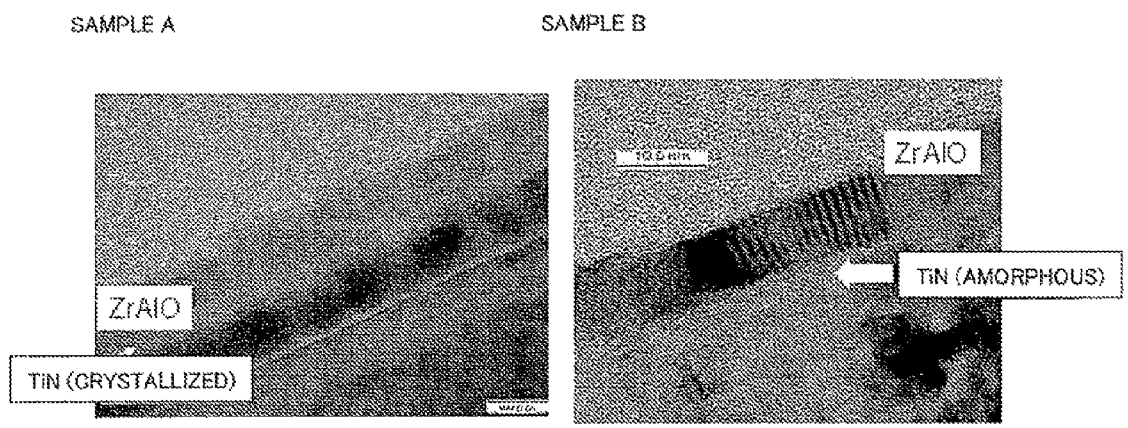
{FIG. 9} A diagram showing a section observation image of a capacitor, which is a semiconductor element, taken by a TEM according to an exemplary embodiment of the present invention.

FIG. 9 shows a section observation image of each of the samples A and B. As shown in FIG. 9, the sample B has an improved surface flatness of the $Zr_{(1-x)}Al_xO_y$ film compared with the sample A; unlike sample B, the formation of an affected layer is not confirmed at the interface between the dielectric film and the lower electrode.

As described above, it is confirmed that in the case of the capacitor that adopts the $Zr_{(1-x)}Al_xO_y$ film as a dielectric film, the element characteristics are significantly affected by the crystallization state of the lower electrode, the affected layer is suppressed at the interface between the dielectric film and the lower electrode on the electrode having an amorphous surface with an improved surface flatness, and it is possible to make the EOT thinner and reduce leakage current.

Here, the amorphous or crystallized TiN is explained as the lower electrode. However, the following layers can also obtain similar effects: a single layer of the amorphous TiN; a laminated film of the amorphous TiN and the crystallized Ti; a laminated film of the amorphous TaN and the crystallized TaN; a single layer of the amorphous TaN; a laminated structure of the amorphous TaN and the crystallized Ta.

In this case, the film is turned into an amorphous state by the radical nitridation process that adds nitrogen. However, similar effects can be obtained by adding carbon for turning the film into an amorphous state.

Here, Au is used for the upper electrode. However, the use of one material selected from the group consisting of TiN, Ti, W, WN, Pt, Ir and Ru for the upper electrode also makes it possible to obtain similar effects.

As described above, according to the present exemplary embodiment, the $Zr_{(1-x)}Al_xO_y$ dielectric film is crystallized; the range of the composition thereof is $0.01 \leq x \leq 0.15$. In order to achieve a remarkable reduction in leakage current, it is preferable that the range be $0.02 \leq x \leq 0.10$ when the film is annealed at 600 degrees Celsius for crystallization or be $0.02 \leq x \leq 0.05$ when the film is annealed at 400 degrees Celsius for crystallization. It is also desirable that the surface contiguous to at least the dielectric film of the lower electrode be composed of a conductor having an amorphous structure. In order to keep the resistance of the lower electrode low, it is preferable that the lower electrode have a laminated structure of the amorphous and crystallized layers.

Incidentally, according to the present exemplary embodiment, the main ingredients of the dielectric substance may be Zr, Al and O with the composition ratio of Zr to Al being set at (1-x): x ($0.01 \leq x \leq 0.15$). Moreover, out of all the metal elements included in the dielectric substance, Zr and Al combined may account for 99% or more of the composition. That is, even if other metal elements, such as Y, are included, the effects of the present exemplary embodiment can be obtained as long as the ratio of the other metal elements to the total is less than 1%.

Incidentally, the metal elements here include metalloid elements such as Si. Out of the elements except the metal elements included in the dielectric substance, oxygen may account for 80% or more of the composition. When oxygen accounts for less than 80% of the composition, it is difficult for the film to be crystallized even after being annealed, making it difficult to obtain a remarkable increase in relative permittivity. That is, even if other elements such as nitrogen are included, there is no problem as long as the ratio of the elements such as nitrogen is less than 20% out of the elements except the metal elements included in the dielectric substance.

The effect of crystallization in reducing leakage current can be obtained even when the annealing temperature is greater than or equal to 350 degrees Celsius and less than 400 degrees Celsius. Even when the annealing temperature is greater than or equal to 600 degrees Celsius, it is possible to achieve a remarkable increase in relative permittivity through crystallization. However, the annealing temperature is realistically at less than 1,000 degrees Celsius since it becomes easier for the deterioration of the electrode and the like to take place due to annealing.

The following describes each example of the present invention with reference to the accompanying drawings.

EXAMPLE 1

Example 1 of the present invention will be described.

Figure 10:
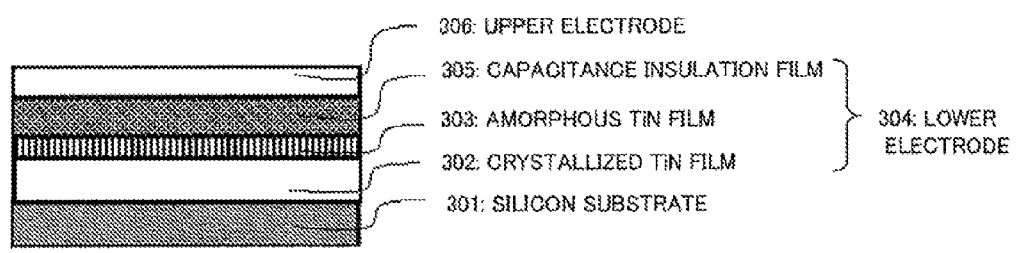
{FIG. 10} A schematic diagram showing the cross-sectional structure of a capacitor, which is a semiconductor element, according to Example 1.

FIG. 10 is a diagram illustrating the cross-sectional structure of a capacitor, which is a semiconductor element, according to the present example. As shown in FIG. 10, on a silicon substrate 303 of the capacitor of the present example, a lower electrode 304, a metal-oxide-layer dielectric film 305 that makes up a capacitance insulation film, and an upper electrode 306 are formed. The lower electrode 304 is a laminated film made up of a lower-layer crystallized TiN 302 and an upper-layer amorphous TiN 303.

The following describes a method of producing the capacitor of the present example.

After the crystallized TiN 302 is deposited on the silicon substrate 301 with a thickness of 20 nm as part of the laminated structure of the lower electrode 304, the amorphous TiN 303 is formed with a thickness of 5 nm. The crystallized TiN film 302 can be made by a sputtering, chemical vapor deposition or ALD (Atomic Layer Deposition) method. The amorphous TiN film 303 is formed by applying a radical nitridation process to a crystallized. TiN film.

Then, on the silicon substrate 301 where the lower electrode 304 having the laminated structure of the crystallized TiN 302 and the amorphous TiN 303 is formed, a $Zr_{(1-x)}Al_xO_y$ film is formed as the metal-oxide-layer dielectric film 305 by a chemical vapor deposition or atomic layer deposition method in the range of 2 nm to 20 nm. The substrate temperature is 300 degrees Celsius. Trimethyl-aluminum ($Al(CH_3)_4$) and tetrakis-dimethylamino-zirconium ($Zr(Net_2)_4$) are used as organic metal ingredients. $H_2O$ is used as an oxidizing agent. A method of forming the film can be set by controlling the partial pressure of the oxidizing agent introduced. When the partial pressure of the oxidizing agent is high, a CVC (Chemical Vapor Deposition) method is used; when the partial pressure is low, an ALD method is used. When a metal source gas and an oxidizing agent are simultaneously supplied, the film can be formed by the CVC method.

Figure 11:
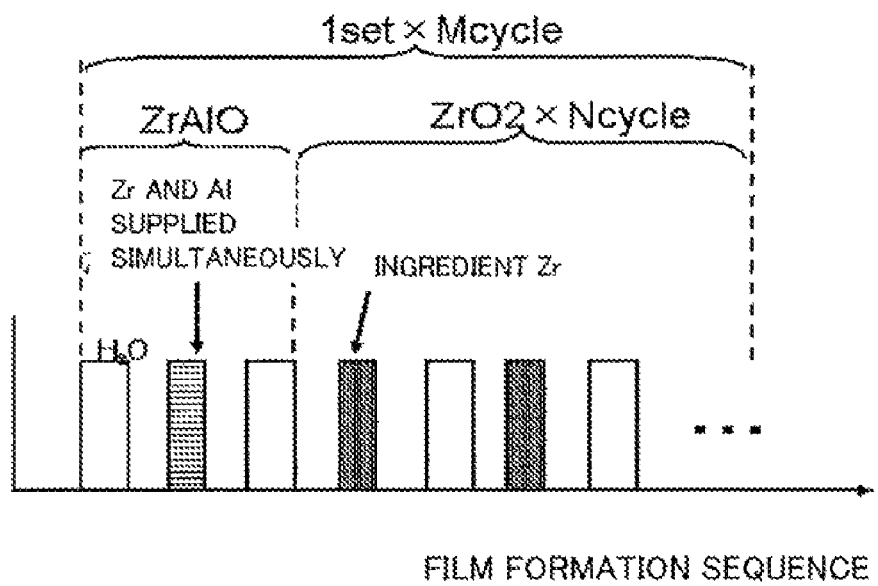
{FIG. 11} A diagram showing a film formation sequence in a process of forming a metal oxide film of a capacitor, which is a semiconductor element, according to Example 1.

FIG. 11 shows a brief overview of a film formation sequence in a process of supplying a source gas in the present example.

As shown in FIG. 11, in the present example, the film formation sequence in the process of supplying a source gas includes: 1) a step of forming a Zr and Al metal oxide layer (referred to as a ZrAlO film, hereinafter); and 2) a step of forming a $ZrO_2$ film.

1) Step of Forming ZrAlO Film

First, an oxidizing agent, $H_2O$, is supplied to the surface of the substrate. $H_2O$ is supplied by a mass flow controller with a flow rate of 5 sccm for 2 seconds. Here, ccm is a unit of flow per minute, i.e. cc ($cm^3$)/min; sccm represents the ccm standardized at Latin and 0 degree Celsius, i.e. standard cc/min. Then, $Al(CH_3)_4$ and $Zr(Net_2)_4$ are supplied at once. The supply of the ingredient Al is controlled by a mass flow controller to be 0.05 sccm. The ingredient Zr is supplied by the bubbling of nitrogen gas with a flow rate of 20 sccm and a 80-degrees-Celsius container; the supplying time of the source gas is 20 seconds at this time.

2) Step of Forming $ZrO_2$ Film

First, an oxidizing agent, $H_2O$, is supplied to the surface of the substrate. $H_2O$ is supplied by a mass flow controller with a flow rate of 5 sccm for 2 seconds. Then, $Zr(Net_2)_4$ is supplied; the supplying time of the source gas is 20 seconds at this time. At this time, the Al composition of the metal oxide layer can be controlled according to the ratio of the number of film-formation cycles of the above ZrAlO to that of the $ZrO_2$ film (film thickness ratio). A process of performing N cycles of the $ZrO_2$ film after the ZrAlO film is formed is regarded as "1set." The "1set" is repeatedly performed a predetermined number of cycles to form a laminated film of ZrAlO and $ZrO_2$ having a desired composition and film thickness. In order to form the $Zr_{(1-x)}Al_xO_y$ film with an All composition of 5% and a thickness of 10 nm, 1 cycle of the ZrAlO film and seven cycles of the $ZrO_2$ film are performed as "1set" and the "1set" is performed 10 cycles.

Figure 12:
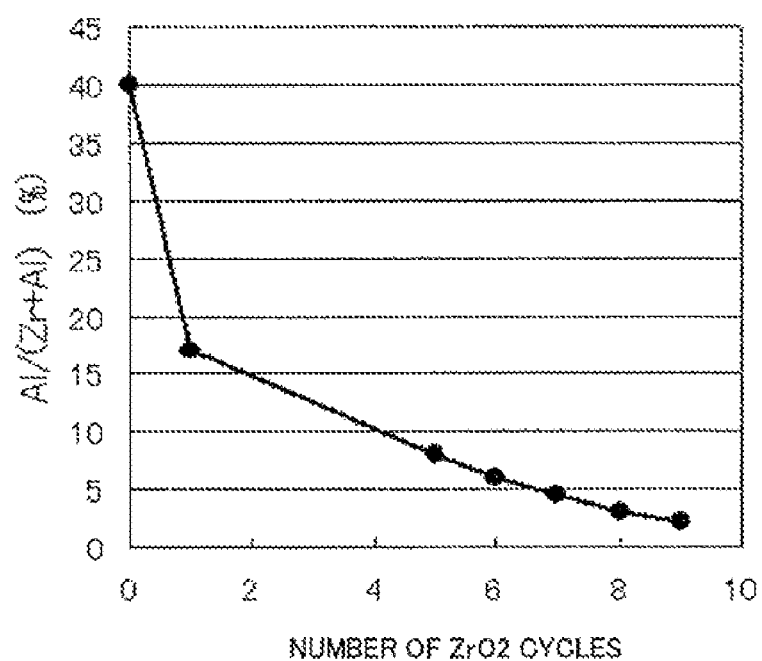
{FIG. 12} A diagram showing the film formation cycle dependency of $ZrO_2$ with the Al composition (Al/(Zr+Al)) of a metal oxide film of a capacitor, which is a semiconductor element, according to Example 1.

FIG. 12 shows the number-of-cycles dependency of the $ZrO_2$ film in the composition of the $Zr_{(1-x)}Al_xO_y$ film formed in the production process of the present example (Horizontal axis: Al/(Zr+Al)[%], Vertical axis: the number of $ZrO_2$ cycles). The composition is evaluated by XPS (X-ray photoelectron spectroscopy) analysis. As shown in the diagram, it is possible to control a wide range of Al composition. It is also confirmed that even with a method that does not introduce the ingredient Zr in the process of forming the ZrAlO film, it is possible to control a wide range of Al composition thanks to the film formation cycle of the $ZrO_2$ film.

With the use of the above formation process, the laminated film of ZrAlO and $ZrO_2$ is formed with an Al composition of $0 \leq x \leq 0.40$ and a thickness of 2 nm to 20 nm. In the film formation process of FIG. 12, the $ZrO_2$ with an Al composition of 0% represents a case in which the process of supplying the ZrAlO film is not performed. Then, an annealing process is performed for 10 minutes at 400 and 600 degrees Celsius under a nitrogen atmosphere; the $Zr_{(1-x)}Al_xO_y$ film 305 is formed with AL diffused evenly into the $ZrO_2$. Incidentally, the annealing process is performed under a nitrogen atmosphere in this case. However, oxygen, Ar and other inert gases may be used when needed. Then, Au is deposited with a film thickness of 100 nm by a vacuum deposition method to form the upper electrode 306.

The relative permittivity of the $Zr_{(1-x)}Al_xO_y$ film formed in the above manner with an Al composition of $0.01 \leq x \leq 0.40$ is evaluated. The results are that the relative permittivity of the $Zr_{(1-x)}Al_xO_y$ film 305 with an Al composition of $0.01 \leq x \leq 0.15$ is higher than that of the $ZrO_2$ with AL=0%, and that the value of the relative permittivity is greater than or equal to 40 and less than and equal to 70.

What is described in the present example is a case where the laminated structure of the amorphous TiN and the crystallized TiN is used as the lower electrode. However, the following layers also bring about similar effects: a single layer of the amorphous TiN; a laminated film of the amorphous TiN and the crystallized Ti; a laminated film of the amorphous TaN and the crystallized TaN; a single layer of the amorphous TaN; a laminated structure of the amorphous TaN and the crystallized Ta.

Moreover, in the present example, the film is turned into an amorphous state by the radical nitridation process that adds nitrogen. However, similar effects can be obtained by adding carbon for turning the film into an amorphous state.

EXAMPLE 2

Example 2 of the present invention will be described.

As for a method of producing a capacitor, which is a semiconductor element of the present example, in similar processes to those of Example 1, the $Zr_{(1-x)}Al_xO_y$ film is formed on an electrode with the Al composition x=0.045 and a thickness of 2 nm to 20 nm; an annealing process is performed for 10 minutes at 400 and 600 degrees Celsius under a nitrogen atmosphere. Then, Au is deposited on the $Zr_{(1-x)}Al_xO_y$ film by a vacuum deposition method with a film thickness of 100 nm to form a capacitor. The laminated electrode of the crystallized or amorphous TiN and the crystallized TiN serves as a first electrode, and the Au as a second electrode.

A voltage is applied to the first electrode of the formed capacitor; the EOT of the element is evaluated by CV measurements, and the leakage current by IV measurements. The results are that EOT=0.7 nm for the $Zr_{(1-x)}Al_xO_y$ film on the crystallized TiN and the leakage current is $1.5 \times 10^{-6}$ $A/cm^2$. Meanwhile, EOT=0.6 nm for the $Zr_{(1-x)}Al_xO_y$ film produced in the form of a laminated film of the amorphous TiN and the crystallized TiN; the leakage current is $1 \times 10^{-7}$ $A/cm^2$.

Given the above, it is confirmed that the semiconductor element of the present example can be turned into a semiconductor device that has made the EOT film thickness thinner and reduced leakage current because of the amorphous surface contiguous to at least the dielectric film as the lower electrode.

In the present example, Au is used for the upper electrode. However, it is confirmed that the use of one material selected from the group consisting of TiN, Ti, W, WN, Pt, Ir and Ru for the upper electrode, as well as the use of a laminated film composed of two of the materials, also makes it possible to obtain similar effects.

EXAMPLE 3

Example 3 of the present invention will be described.

FIGS. 13 to 18 are cross-sectional diagrams showing the process sequence of a method of producing a semiconductor device having a capacitor, which is a semiconductor device of the present example.

Figure 13A:
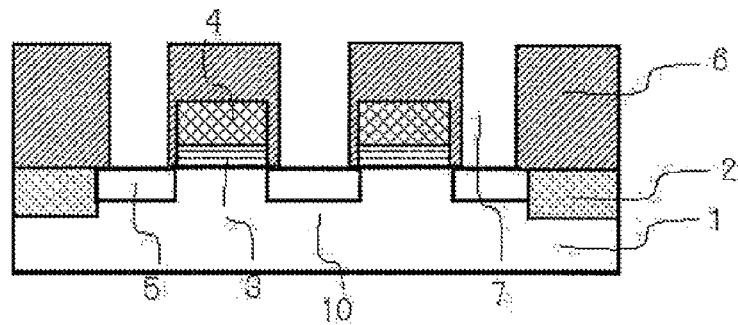
{FIG. 13} Cross-sectional diagrams, FIGS. 13A and 13B, showing steps of a production process of a semiconductor device having a capacitor, which is a semiconductor element, according to Example 3.

First, as shown in FIG. 13A, an element isolation region 2 is formed by a LOCOS (Local Oxidation of Silicon) method or STI (Shallow Trench Isolation) method on the surface region of a p-type silicon substrate 1.

In an active region encircled by the element isolation region 2, a silicon oxide film and a polycrystalline silicon film are sequentially formed; with the use of a lithographic technique and RIE (Reactive Ion Etching) technique, the laminated film is processed into a desired shape to form a gate oxide film 3 and a gate electrode 4.

Then, ion implantation is conducted using the gate oxide film 3 and the gate electrode 4 as masks to introduce n-type impurities into the silicon substrate 1. A plurality of n-type diffusion regions 5 are therefore formed in a self-aligning manner: the n-type diffusion regions 5 will become source or drain regions. Subsequently, a first interlayer insulation film 6 composed of a silicon oxide film is formed across the entire surface by a CVD method. As a result, a memory selection transistor 10 consists of a MOS (Metal Oxide Semiconductor) transistor, is formed.

In this case, the diffusion regions 5 that make up the above source or drain regions may have a LDD (Lightly Doped Drain) structure in which a high-level impurity region and a low-level impurity region are combined or a non-LLD structure of a high-level impurity concentration region.

A silicide layer may be formed in the source/drain regions by a salicide method. In terms of contact resistance, the silicide layer may use Ni silicide, Co silicide or Ti silicide.

Subsequently, with the use of a photolithography method, contact holes 7 are formed by the selective etching of the first interlayer insulation film 6 in a way that exposes the diffusion regions.

Figure 13B:
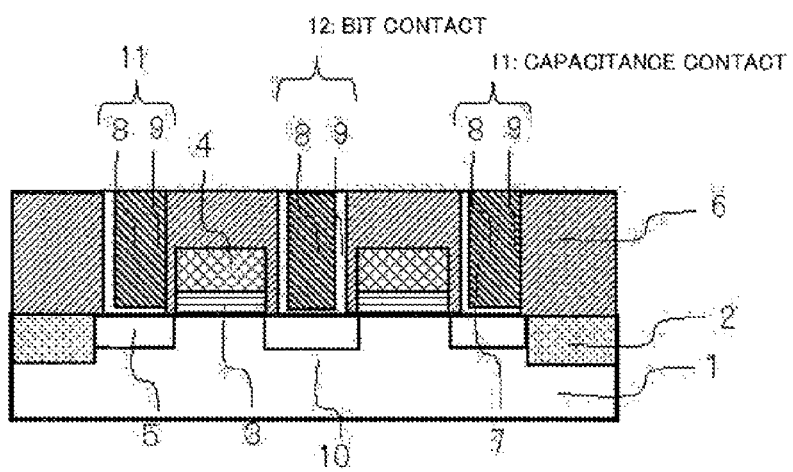

Then, as shown in FIG. 13B, a TiN film 8 is formed as a barrier metal across the entire surface by a CVD method or PVD (Physical Vapor Deposition) method; a W (tungsten) film 9 is then formed across the entire surface by a CVD method. After that, the surface of the first interlayer insulation film 6 is made flat by a CMP (Chemical Mechanical Polishing) method to remove the unnecessary TiN film 8 and W film 9. Capacitance contacts 11 and a bit contact 12 are therefore formed in the contact holes 7 so as to be connected to the diffusion regions 5.

Figure 14A:
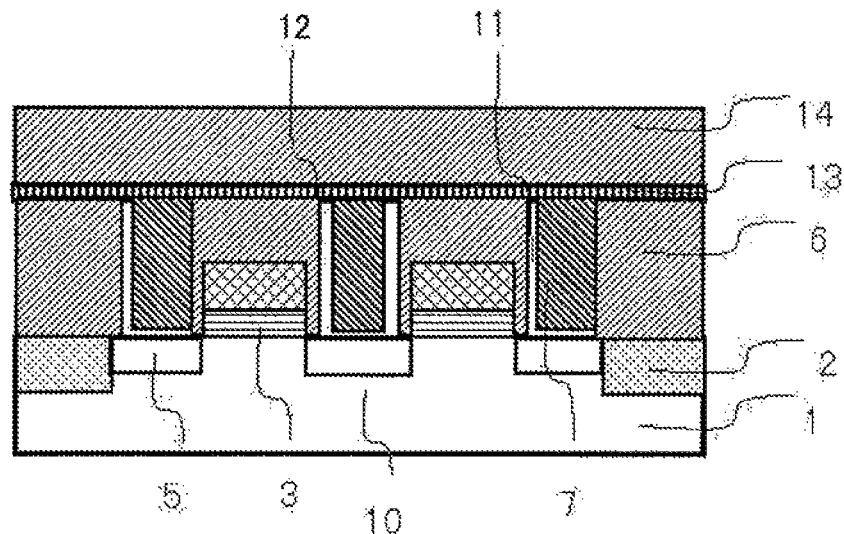
{FIG. 14} Cross-sectional diagrams, FIGS. 14A and 14B, showing the subsequent steps of the production process of the semiconductor device of Example 3 that follow the production steps of FIG. 13.

Subsequently, as shown in FIG. 14A, a stopper insulation film 13 composed of a silicon oxynitride (SiON) film is formed across the entire surface by a CVD method; a second interlayer insulation film 14 composed of a silicon oxide film is then formed.

Figure 14B:
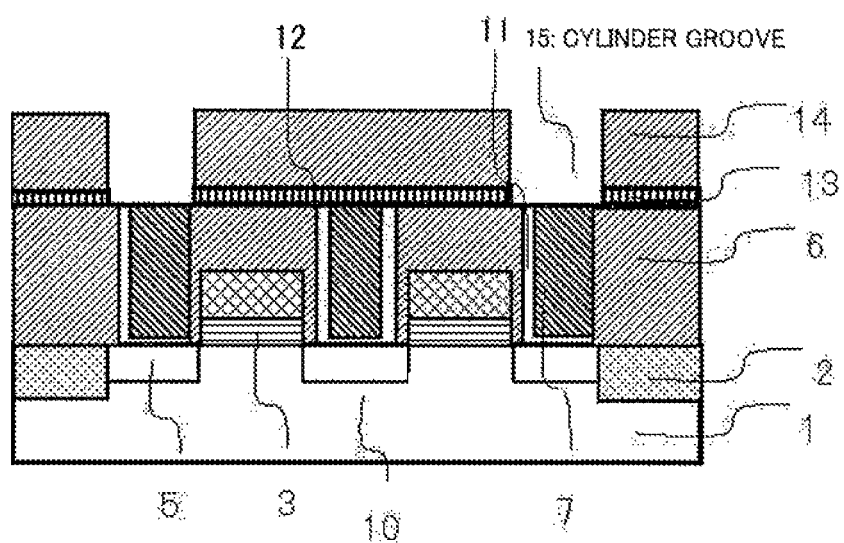

Then, as shown in FIG. 14B, with the use of a photolithography method, cylinder grooves 15 are formed by the selective etching of the second interlayer insulation film 14 in a way that exposes the capacitance contacts 11.

Figure 15A:
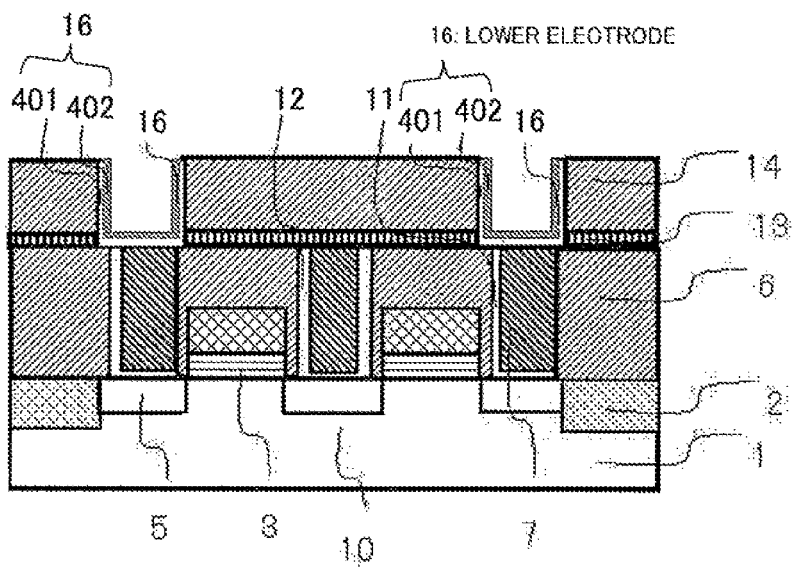
{FIG. 15} Cross-sectional diagrams, FIGS. 15A and 15B, showing the subsequent steps of the production process of the semiconductor device of Example 3 that follow the production steps of FIG. 14.

Subsequently, as shown in FIG. 15A, with the use of a CVD method or ALD method, TiN films 401 are formed in the cylinder grooves 15 with a thickness of 20 nm to 40 nm; amorphous TiN films 402 are then formed with a thickness of 1 nm to 10 nm. After lower electrodes (first electrodes) 16 are formed, unnecessary portions are removed by a photolithography method so that the remaining lower electrode films in the capacitance contacts 11 make up the lower electrodes 16.

Figure 15B:
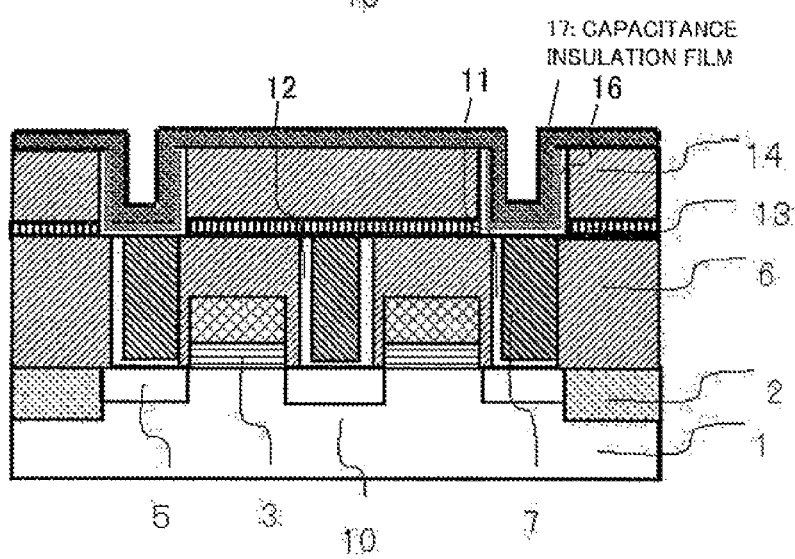

Then, as shown in FIG. 15B, a capacitance insulation film 17 of a capacitor is formed on the lower electrodes 16 by an ALD method or CVD method. In this case, the capacitance insulation film 17 is formed in a similar way to that of Example 1 with the use of the film formation sequence illustrated in FIG. 11. The composition of $Zr_{(1-x)}Al_xO_y$ of the formed capacitance insulation film 17 is in the range $0 \leq x \leq 0.4$. The thickness of the formed capacitance insulation film 17 is in the range of 2 nm to 20 nm. After the capacitance insulation film 17 is formed, an annealing process is performed for 10 minutes at 400 degrees Celsius under a nitrogen atmosphere.

Figure 16A:
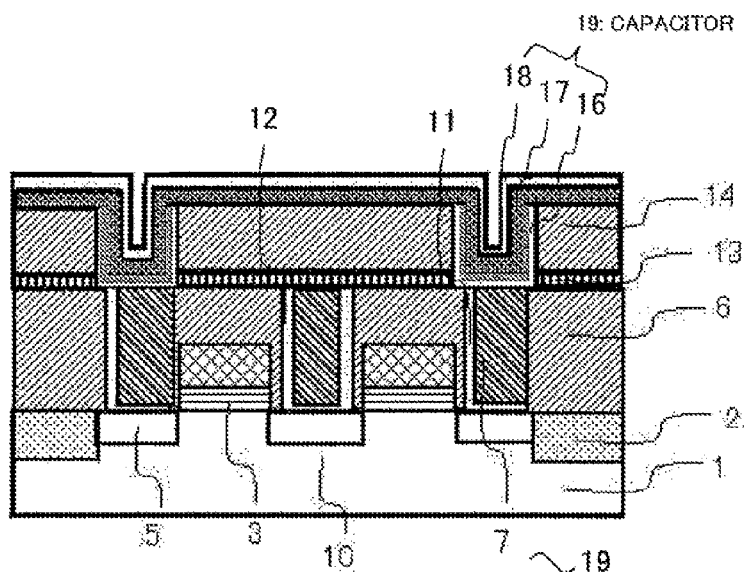
{FIG. 16} Cross-sectional diagrams, FIGS. 16A and 16B, showing the subsequent steps of the production process of the semiconductor device of Example 3 that follow the production steps of FIG. 15.

Subsequently, as shown in FIG. 16A, with the use of a CVD method or ALD method, an upper electrode (second electrode) 18 composed of a TiN film is formed.

As a result, a capacitor 19 is formed that has a MIM structure including the lower electrodes 16, the capacitance insulation film 17 and the upper electrode 18. As for the capacitor structure of a DRAM (Dynamic Random Access Memory) capacitance section, in terms of securing a capacitance value, it is preferable, as in the present example, that the lower electrode 16's plane facing the upper electrode 18 and the upper electrode 18's plane facing the lower electrode 16 have a structure with a large surface area, like a cylindrical structure having a plane substantially parallel to the substrate 1 and a plane substantially perpendicular to the substrate 1.

Figure 16B:
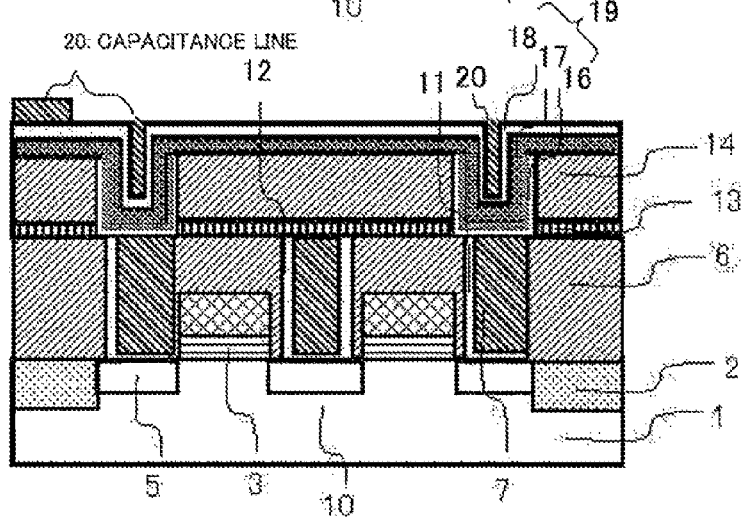

Subsequently, as shown in FIG. 16B, capacitance lines 20 composed of a W film are formed across the entire surface by a CVD method and connected to the upper electrode 18 of the capacitor 19.

Figure 17A:
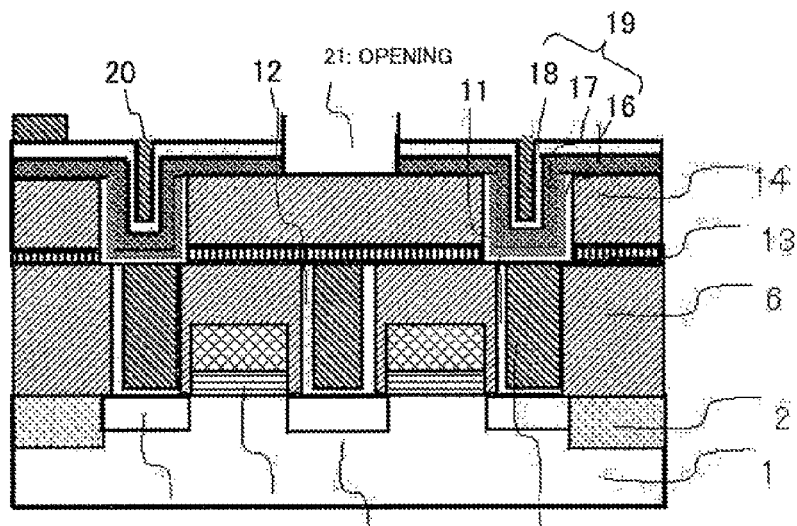
{FIG. 17} Cross-sectional diagrams, FIGS. 17A and 17B, showing the subsequent steps of the production process of the semiconductor device of Example 3 that follow the production steps of FIG. 16.

Then, as shown in FIG. 17A, an opening 21 is formed in a way that exposes the second interlayer insulation film 14 above the bit contact 12.

Figure 17B:
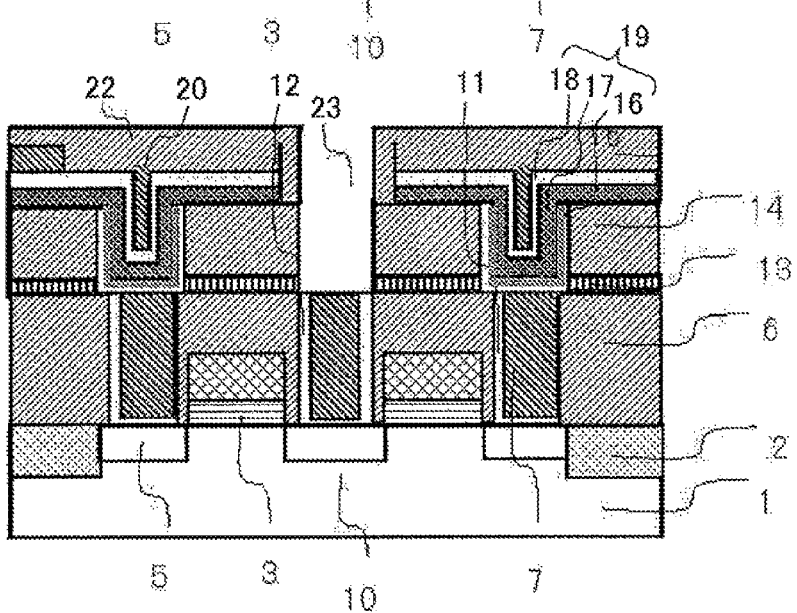

Subsequently, as shown in FIG. 17B, a third interlayer insulation film 22 composed of a silicon oxide film is formed across the entire surface by a CVD method. After that, with the use of a photolithography method, a contact hole 23 is formed inside the opening 21 by the selective etching of the third interlayer insulation film 22 in a way that exposes the bit contact 12.

Figure 18:
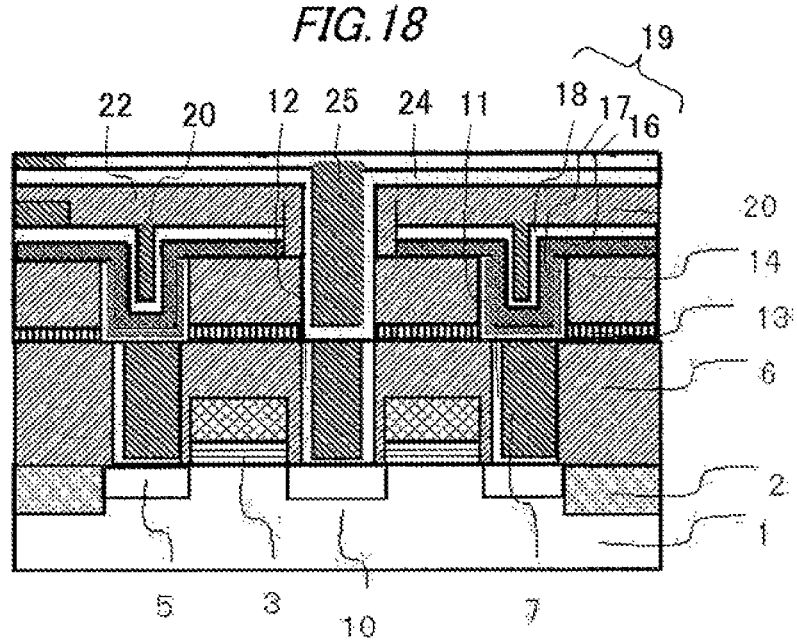
{FIG. 18} A cross-sectional diagram showing the subsequent step of the production process of the semiconductor device of Example 3 that follow the production steps of FIG. 17.

Then, as shown in FIG. 18, a TiN film 24 is formed as a barrier metal across the entire surface by a CVD method; a bit line 25 composed of a W film is then formed across the entire surface by a CVD method so as to be connected to the bit contact 12. As a result, the semiconductor device is completed.

According to the semiconductor device of the present example, what is used as the lower electrode 16 is the laminated structure of the crystallized TiN 401 and the amorphous TiN 402; the $Zr_{(1-x)}Al_xO_y$ film is used for the dielectric film that makes up the capacitance insulation film 17 of the capacitor; the Al composition is set at $0.01 \leq x \leq 0.15$. Compared with the dielectric film composed of the $ZrO_2$ with Al=0%, the relative permittivity has increased. As a result, it is confirmed that the leakage current has decreased more than that of the $ZrO_2$ with the same EOT film thickness.

As described above, it is confirmed that even when the capacitor structure of Example 1 is applied to a semiconductor device having a cylindrical structure (tubular structure), the effects thereof are obtained.

Incidentally, in the present example, a MOS transistor is used for a switching element. However, other elements having the function of a switching element, such as field-effect transistors, may be selected for use when needed.

What is described in the present example is a case where the laminated structure of the amorphous TiN and the crystallized TiN is used as the lower electrode 16. However, the following layers also bring about similar effects: a single layer of the amorphous TiN; a laminated film of the amorphous TiN and the crystallized Ti; a laminated film of the amorphous TaN and the crystallized TaN; a single layer of the amorphous TaN; a laminated structure of the amorphous TaN and the crystallized Ta.

Moreover, in the present example, the film is turned into an amorphous state by the radical nitridation process that adds nitrogen. However, similar effects can be obtained by adding carbon for turning the film into an amorphous state.

In the present example, TiN is used for the upper electrode 18. However, the use of one material selected from the group consisting of W, WN, Pt, Ir and Ru also makes it possible to obtain similar effects.

EXAMPLE 4

Example 4 of the present invention will be described in detail with reference to the accompanying drawings.

Figure 19:
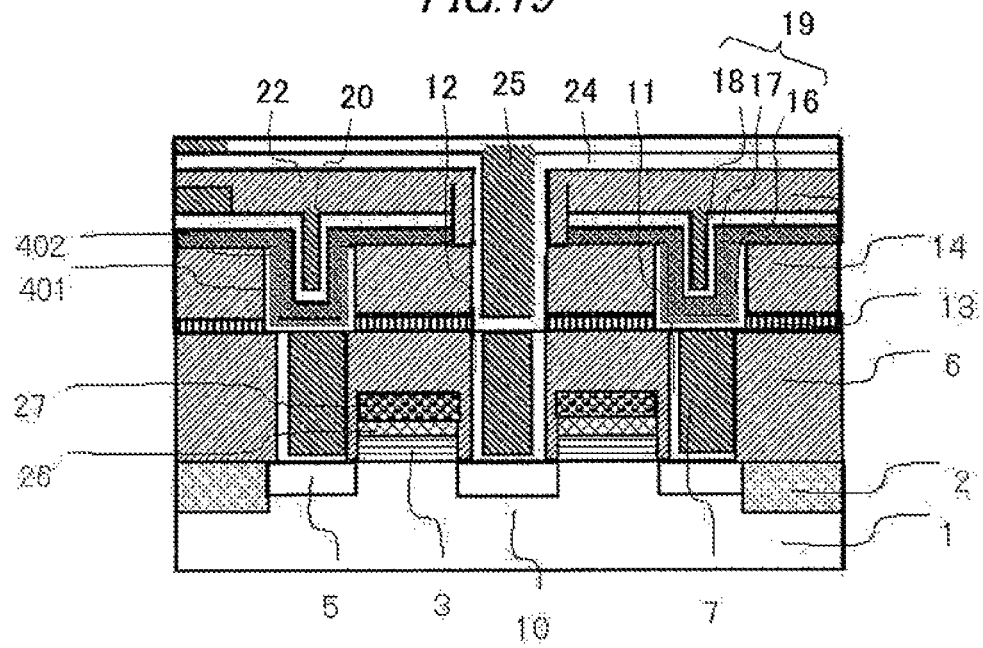
{FIG. 19} A cross-sectional diagram of a semiconductor device having a capacitor, which is a semiconductor element, according to Example 4.

FIG. 19 is a diagram illustrating the cross-sectional structure of a semiconductor device of the present example. The present example is different from Example 3 in that the gate electrode of the transistor in Example 3 is made with a layer of polycrystalline silicon 26 containing n-type impurities and a layer of tungsten 27. The processes following the formation of the gate electrode are the same as in Example 3.

According to the semiconductor device of the present example, what is used as the lower electrode 16 of the capacitor is the laminated structure of the crystallized TiN 401 and the amorphous TiN 402; the $Zr_{(1-x)}Al_xO_y$ film is used for the dielectric film that makes up the capacitance insulation film 17; the Al composition is set at $0.01 \leq x \leq 0.15$. Compared with the dielectric film composed of the $ZrO_2$ with Al=0%, the relative permittivity has increased. As a result, it is confirmed that the leakage current has decreased more than that of the $ZrO_2$ with the same EOT film thickness.

In the present example, what is used as the gate electrode is the laminated structure of polycrystalline silicon and tungsten containing n-type impurities such as boron or arsenic. It is confirmed that the use of tungsten nitride, tungsten silicide, nickel silicide or cobalt silicide, instead of tungsten, brings about similar effects.

The diffusion regions 5 that make up the source or drain regions may have a LDD structure in which a high-level impurity region and a low-level impurity region are combined or a non-LLD structure of a high-level impurity region. A silicide layer may be formed in the source/drain regions by a salicide method. In terms of contact resistance, the silicide layer may use Ni silicide, Co silicide or Ti silicide.

In the present example, a MOS transistor is used for a switching element. However, other elements having the function of a switching element, such as field-effect transistors, may be selected for use when needed.

What is described in the present example is a case where the laminated structure of the amorphous TiN and the crystallized TiN is used as the lower electrode 16. However, the following layers also bring about similar effects: a single layer of the amorphous TiN; a laminated film of the amorphous TiN and the crystallized Ti; a laminated film of the amorphous TaN and the crystallized TaN; a single layer of the amorphous TaN; a laminated structure of the amorphous TaN and the crystallized Ta.

Moreover, in the present example, the film is turned into an amorphous state by the radical nitridation process that adds nitrogen. However, similar effects can be obtained by adding carbon for turning the film into an amorphous state.

In the present example, TiN is used for the upper electrode 18. However, it is confirmed that the use of one material selected from the group consisting of W, WN, Pt, Ir and Ru also makes it possible to obtain similar effects.

EXAMPLE 5

Example 5 of the present invention will be described in detail with reference to the accompanying drawings.

Figure 20:
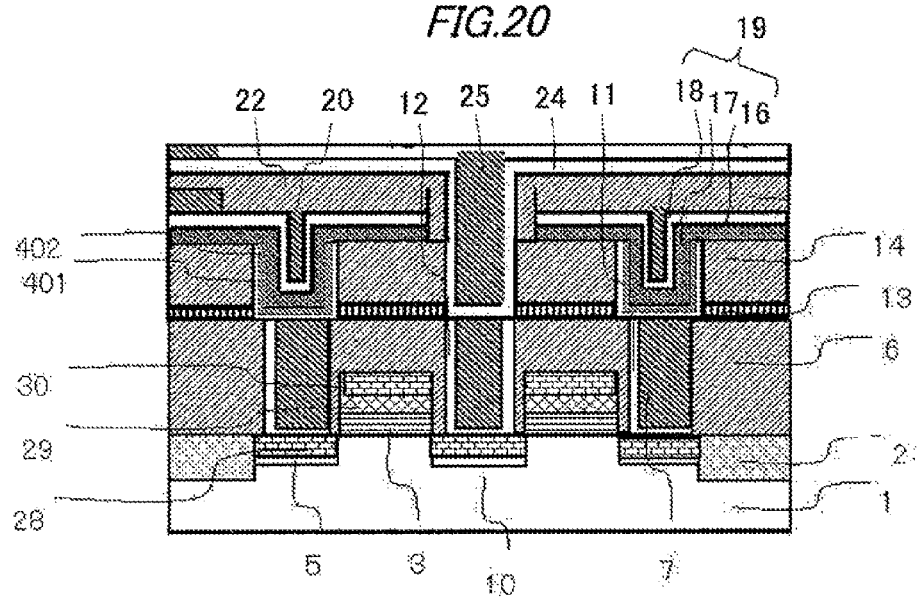
{FIG. 20} A cross-sectional diagram of a semiconductor device having a capacitor, which is a semiconductor element, according to Example 5.

FIG. 20 is a diagram illustrating the cross-sectional structure of a semiconductor device of the present example. The present example is different from Examples 3 and 4 in that metal silicide layers 28 composed of a nickel silicide layer are formed on portions of the source/drain diffusion regions of a transistor of Examples 3 and 4, and that layers of polycrystalline silicon 29 containing n-type impurities such as boron or arsenic and metal silicide layers 30 composed of nickel silicide are formed as the gate electrodes. The processes following the formation of the gate electrodes are the same as in Example 3 except that the annealing temperatures for the dielectric film are different. In this case, the annealing process of the dielectric film is performed for 10 minutes at 400 degrees Celsius under a nitrogen atmosphere.

According to the semiconductor device of the present example, what is used as the lower electrode 16 of the capacitor is the laminated structure of the crystallized TiN 401 and the amorphous TiN 402; the $Zr_{(1-x)}Al_xO_y$ film is used for the dielectric film that makes up the capacitance insulation film 17; the Al composition is set at $0.01 \leq x \leq 0.15$. Compared with the dielectric film composed of the $ZrO_2$ with Al=0%, the relative permittivity has increased. As a result, it is confirmed that the leakage current has decreased more than that of the $ZrO_2$ with the same EOT film thickness. It is confirmed that the $Zr_{(1-x)}Al_xO_y$ film with the composition $0.01 \leq x \leq 0.08$ has been crystallized and has the same tetragonal structure as the $ZrO_2$.

A drop of element characteristics associated with the deterioration of the Ni silicide regions of the source/drain regions of the transistor section is not confirmed.

In the present example, Ni silicide is partially used for the source/drain diffusion regions and the gate electrodes. However, it is confirmed that the use of Co silicide or a silicide layer composed of a compound of Ni and Pt, instead of Ni silicide, also brings about similar effects.

Incidentally, in the present example, a MOS transistor is used for a switching element. However, other elements having the function of a switching element, such as field-effect transistors, may be selected for use when needed.

What is described in the present example is a case where the laminated structure of the amorphous TiN and the crystallized TiN is used as the lower electrode 16. However, the following layers also bring about similar effects: a single layer of the amorphous TiN; a laminated film of the amorphous TiN and the crystallized Ti; a laminated film of the amorphous TaN and the crystallized TaN; a single layer of the amorphous TaN; a laminated structure of the amorphous TaN and the crystallized Ta.

Moreover, in the present example, the film is turned into an amorphous state by the radical nitridation process that adds nitrogen. However, similar effects can be obtained by adding carbon for turning the film into an amorphous state.

In the present example, TiN is used for the upper electrode 18. However, it is confirmed that the use of one material selected from the group consisting of W, WN, Pt, Ir and Ru also makes it possible to obtain similar effects.

As described above, in the present example, the capacitance insulation film 17 can be made by the 400-degrees- Celsius thermal process, making it possible to avoid the deterioration of the metal silicide region of the transistor section caused by the thermal process, or the process of annealing at 600 degrees Celsius or more.

EXAMPLE 6

Example 6 of the present invention will be described in detail with reference to the accompanying drawings.

Figure 21:
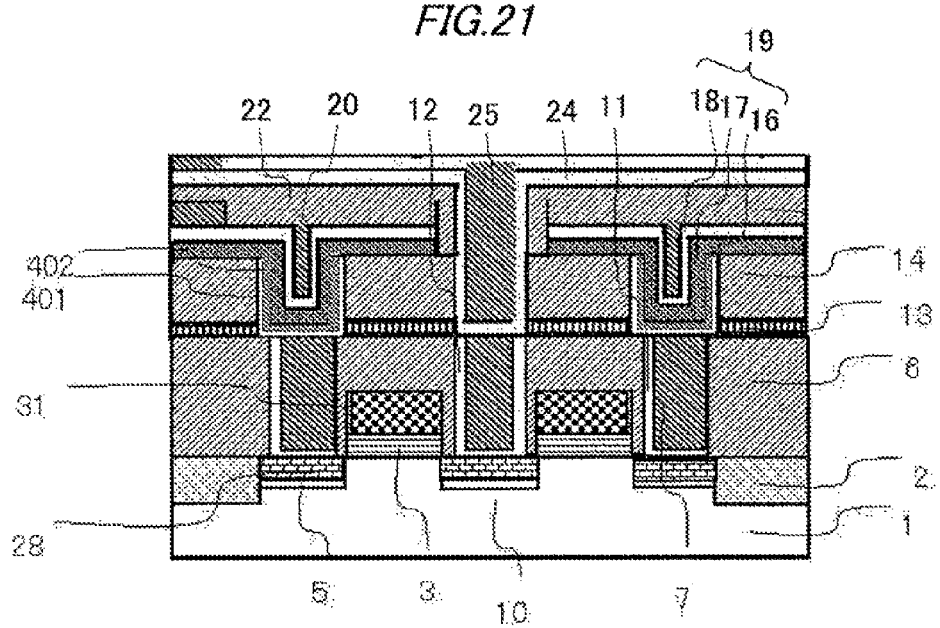
{FIG. 21} A cross-sectional diagram of a semiconductor device having a capacitor, which is a semiconductor element, according to Example 6.

FIG. 21 is a diagram illustrating the section of a semiconductor device of the present example. The present example is different from Example 5 in that nickel silicide layers 31 are formed as the gate electrodes of the transistor of Example 5. The processes following the formation of the gate electrodes are the same as in Example 5.

According to the semiconductor device of the present example, what is used as the lower electrode 16 of the capacitor is the laminated structure of the crystallized TiN 401 and the amorphous TiN 402; the $Zr_{(1-x)}Al_xO_y$ film is used for the dielectric film that makes up the capacitance insulation film 17; the Al composition is set at $0.01 \leq x \leq 0.08$. Compared with the dielectric film composed of the $ZrO_2$ with Al=0%, the relative permittivity has increased. As a result, it is confirmed that the leakage current has decreased more than that of the $ZrO_2$ with the same EOT film thickness. It is confirmed that the $Zr_{(1-x)}Al_xO_y$ film with the composition $0.01 \leq x \leq 0.08$ has been crystallized and has the same tetragonal structure as the $ZrO_2$.

A drop of element characteristics associated with the deterioration of the Ni silicide regions of the gate electrodes and source/drain regions of the transistor section is not confirmed.

Incidentally, in the present example, a MOS transistor is used for a switching element. However, other elements having the function of a switching element, such as field-effect transistors, may be selected for use when needed.

What is described in the present example is a case where the laminated structure of the amorphous TiN and the crystallized TiN is used as the lower electrode 16. However, the following layers also bring about similar effects: a single layer of the amorphous TiN; a laminated film of the amorphous TiN and the crystallized Ti; a laminated film of the amorphous TaN and the crystallized TaN; a single layer of the amorphous TaN; a laminated structure of the amorphous TaN and the crystallized Ta.

Moreover, in the present example, the film is turned into an amorphous state by the radical nitridation process that adds nitrogen. However, similar effects can be obtained by adding carbon for turning the film into an amorphous state.

In the present example, TiN is used for the upper electrode 18. However, the use of one material selected from the group consisting of W, WN, Pt, Ir and Ru also makes it possible to obtain similar effects.

As described above, in the present example, the capacitor can be made by the thermal process with a temperature of 400 degrees Celsius or less, making it possible to avoid the deterioration of the metal silicide region of the transistor section caused by the thermal process, or the process of annealing at 600 degrees Celsius or more.

Incidentally, according to the exemplary embodiment of the present invention, a capacitor includes: a capacitance insulation film; and an upper electrode and lower electrode each formed on both sides of the capacitance insulation film. The capacitance insulation film is a complex oxide whose main ingredients are Zr, Al and O with the composition ratio of Zr to Al being set at (1−x): x ($0.01 \leq x \leq 0.15$) and is composed of a dielectric substance having a crystal structure; the lower electrode is composed of a conductor whose surface contiguous to at least the capacitance insulation film has an amorphous structure.

With the above configuration, the lower electrode may have a laminated structure of a polycrystalline film and an amorphous film. The lower electrode may have a laminated structure of an amorphous film and a metal polycrystalline film to which at least nitrogen or carbon is added. The major constituent element of the lower electrode may be at least one metal or metal nitride selected from the group consisting of Ta, TaN, Ti and TiN.

The dielectric substance may have a composition of $Zr_{(1-x)}Al_xO_y$ ($0.01 \leq x \leq 0.15$, $1 \leq y \leq 2-0.5x$). The dielectric substance may have a composition of $Zr_{(1-x)}Al_xO_y$ ($0.02 \leq x \leq 0.10$, $1 \leq y \leq 2-0.5x$). The dielectric substance may have a composition of $Zr_{(1-x)}Al_xO_y$ ($0.02 \leq x \leq 0.5$, $1 \leq y \leq 2-0.5x$).

The upper electrode may be composed of at least one metal or metal nitride selected from the group consisting of TiN, Ti, W, Pt, Ir and Ru.

The capacitor may have a three-layer structure made up of the lower electrode, the capacitance insulation film and the upper electrode; the three-layer structure may have a plurality of portions formed on different surfaces or may have a plurality of portions that cross each other at right angles. That is, some portions of the three-layer structure may be formed on different surfaces from the others or may cross the others at right angles. The capacitor may have a tubular structure (cylindrical structure) in at least some portion.

According to the exemplary embodiment of the present invention, the semiconductor device includes: one of the above capacitors; and a semiconductor substrate at least a surface of which is composed of a semiconductor. The capacitor is formed on the semiconductor substrate. With the above configuration, a switching element may be formed on the semiconductor substrate; and the capacitor and the switching element may be electrically connected.

According to the exemplary embodiment of the present invention, a method of producing a capacitor having a capacitance insulation film and an upper electrode and lower electrode each formed on both sides of the capacitance insulation film includes: a step of forming, as the lower electrode, a first electrode composed of a conductor whose surface contiguous to at least the capacitance insulation film has an amorphous structure; a step of forming, as the capacitance insulation film, a dielectric film that is a complex oxide whose main ingredients are Zr, Al and O with the composition ratio of Zr to Al being set at (1−x): x ($0.01 \leq x \leq 0.15$) and has a crystal structure; and a step of forming, as the upper electrode, a second electrode. With the above configuration, a stem of forming the first electrode may be replaced with a step of forming a laminated structure of a polycrystalline film and an amorphous film.

According to the exemplary embodiment of the present invention, a method of producing a semiconductor device uses the above method of producing the capacitor to form a capacitor having the first electrode, the dielectric film and the second electrode on a semiconductor substrate at least a surface of which is composed of a semiconductor.

The above has described the present invention with reference to the exemplary embodiment and examples. However, the present invention is not limited to the above exemplary embodiment and examples. Various modifications apparent to those skilled in the art may be made in the configuration and details of the present invention without departing from the scope of the present invention.

{Industrial Applicability}

As described above, the present invention can be applied to a capacitor and a semiconductor device having the capacitor. In particular, the present invention can be applied to a capacitor that uses, as a dielectric substance, a complex oxide film containing Zr and Al as well as to a semiconductor device having the capacitor.

The invention claimed is:

1. A capacitor comprising:
   a capacitance insulation film; and
   an upper electrode and lower electrode each formed on both sides of the capacitance insulation film,
   the capacitance insulation film being a complex oxide whose main ingredients are Zr, Al and O with the composition ratio of Zr to Al being set at (1−x): x ($0.01 \leq x \leq 0.15$) and being composed of a dielectric substance having a crystal structure, and
   the lower electrode being composed of a conductor whose surface contiguous to at least the capacitance insulation film has an amorphous structure, wherein
   the dielectric substance has a composition of $Zr_{(1-x)}Al_xO_y$ ($0.01 \leq x \leq 0.15$, $1 \leq y \leq 2-0.5x$).

2. The capacitor according to claim 1, wherein the lower electrode has a laminated structure of a polycrystalline film and an amorphous film, with the amorphous film contiguous to the capacitance insulation film.

3. The capacitor according to claim 1, wherein the lower electrode has a laminated structure of an amorphous film and a metal polycrystalline film to which at least nitrogen or carbon is added, with the amorphous film contiguous to the capacitance insulation film.

4. The capacitor according to claim 1, wherein the major constituent element of the lower electrode is at least one metal or metal nitride selected from the group consisting of Ta, TaN, Ti and TiN.

5. The capacitor according to claim 1, wherein the dielectric substance has a composition of $Zr_{(1-x)}Al_xO_y$ ($0.02 \leq x \leq 0.10$, $1 \leq y \leq 2-0.5x$).

6. The capacitor according to claim 1, wherein the dielectric substance has a composition of $Zr_{(1-x)}Al_xO_y$ ($0.02 \leq x \leq 0.05$, $1 \leq y \leq 2-0.5x$).

7. The capacitor according to claim 1, wherein the upper electrode is composed of at least one metal or metal nitride selected from the group consisting of TiN, Ti, W, Pt, Ir and Ru.

8. The capacitor according to claim 1, further comprising a tubular structure in at least some portion.

9. The capacitor according to claim 1, wherein the dielectric substance has a composition of $Zr_{(1-x)}Al_xO_y$ ($0.01 \leq x \leq 0.08$, $1 \leq y \leq 2-0.5x$).

10. The capacitor according to claim 1, comprising a three-layer structure made up of the lower electrode, the capacitance insulation film and the upper electrode, wherein
    the three-layer structure has a plurality of portions formed on different surfaces.

11. The capacitor according to claim 10, wherein the three-layer structure has a plurality of portions that cross each other at right angles.

12. A semiconductor device comprising:
    the capacitor according to claim 1; and
    a semiconductor substrate at least a surface of which is composed of a semiconductor,
    the capacitor being formed on the semiconductor substrate.

13. The semiconductor device according to claim 12, wherein:
    a switching element is formed on the semiconductor substrate; and
    the capacitor and the switching element are electrically connected.

14. A method of producing a capacitor having a capacitance insulation film and an upper electrode and lower electrode each formed on both sides of the capacitance insulation film, the method comprising:
    a step of forming, as the lower electrode, a first electrode composed of a conductor whose surface contiguous to at least the capacitance insulation film has an amorphous structure;
    a step of forming, as the capacitance insulation film, a dielectric film that is a complex oxide whose main ingredients are Zr, Al and O with the composition ratio of Zr to Al being set at (1−x): x ($0.01 \leq x \leq 0.15$) and is composed of a dielectric substance having a crystal structure; wherein the dielectric substance has a composition of $Zr_{(1-x)}Al_xO_y$ ($0.01 \leq x \leq 0.15$, $1 \leq y \leq 2-0.5x$); and
    a step of forming, as the upper electrode, a second electrode.

15. The method of producing the capacitor according to claim 14, wherein
    the step of forming the first electrode is a step of forming a laminated structure of a polycrystalline film and an amorphous film.

16. A method of producing a semiconductor device, comprising:
    with the use of the method of producing the capacitor according to claim 14, on a semiconductor substrate at least a surface of which is composed of a semiconductor, forming a capacitor having the first electrode, the dielectric film and the second electrode.

* * * * *